United States Patent
Choi et al.

(10) Patent No.: US 9,768,387 B2
(45) Date of Patent: Sep. 19, 2017

(54) ORGANIC LIGHT EMITTING DIODE AND ORGANIC LIGHT EMITTING DISPLAY APPARATUS HAVING THE SAME

(71) Applicant: Samsung Display Co., Ltd., Yongin, Gyeonggi-do (KR)

(72) Inventors: Hyun-Ju Choi, Seoul (KR); Chang-Ho Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 862 days.

(21) Appl. No.: 14/190,047

(22) Filed: Feb. 25, 2014

(65) Prior Publication Data
US 2015/0014651 A1  Jan. 15, 2015

(30) Foreign Application Priority Data
Jul. 10, 2013  (KR) .................. 10-2013-0080777

(51) Int. Cl.
*H01L 51/00* (2006.01)
*H01L 51/50* (2006.01)

(52) U.S. Cl.
CPC ...... *H01L 51/0058* (2013.01); *H01L 51/0052* (2013.01); *H01L 51/0054* (2013.01); *H01L 51/0067* (2013.01); *H01L 51/5072* (2013.01)

(58) Field of Classification Search
None
See application file for complete search history.

(56) References Cited

U.S. PATENT DOCUMENTS

| 2011/0057175 A1* | 3/2011 | Kim ............... C07D 471/04 257/40 |
| 2011/0114974 A1* | 5/2011 | Song ............... H01L 51/5265 257/89 |
| 2011/0121268 A1* | 5/2011 | Nagao ............. H01L 51/0054 257/40 |
| 2011/0278558 A1 | 11/2011 | Hamada |

FOREIGN PATENT DOCUMENTS

| KR | 10-2011-0040874 A | 4/2011 |
| KR | 10-2011-0125861 A | 11/2011 |
| KR | 10-2012-0071263 A | 7/2012 |

\* cited by examiner

*Primary Examiner* — Nathan T Leong
(74) *Attorney, Agent, or Firm* — Lewis Roca Rothgerber Christie LLP

(57) ABSTRACT

An organic light emitting diode includes a hole injection layer, a hole transport layer, an emission layer, an electron transport layer and an electron injection layer. The hole transport layer is disposed on the hole injection layer. The emission layer is disposed on the hole transport layer. The electron transport layer is disposed on the emission layer and including at least one selected from an anthracene derivative and a pyrene derivative. The electron injection layer is disposed on the electron transport layer. The organic light emitting diode includes a material that electron mobility is lower than a traditional material of the electron transport layer. Thus, a stain and a roll-off phenomenon in the low gray scale area may be improved.

14 Claims, 3 Drawing Sheets

341

ORGANIC LIGHT EMITTING DIODE AND ORGANIC LIGHT EMITTING DISPLAY APPARATUS HAVING THE SAME

CROSS-REFERENCE TO RELATED APPLICATION

This application claims priority to and the benefit of Korean Patent Application No. 10-2013-0080777, filed on Jul. 10, 2013, in the Korean Intellectual Property Office, the disclosure of which is incorporated by reference herein in its entirety.

BACKGROUND

1. Field

Embodiments of the present invention relate to an organic light emitting diode and an organic light emitting display apparatus having the same.

2. Description of the Related Art

An organic light emitting display apparatus displays an image by using an organic light emitting diode (OLED) that generates a light by itself. Thus, the organic light emitting diode does not need a backlight, so that the size, thickness, weight and power consumption of an organic light emitting display apparatus including the organic light emitting diode may be decreased. Furthermore, the color reproducibility and response time of the organic light emitting diode are excellent, so that the display quality can be improved.

The organic light emitting diode may be divided into either a fluorescence organic light emitting diode or a phosphorescence organic light emitting diode depending on an emitting path of the organic molecules. The inner quantum efficiency of the fluorescence organic light emitting diode is about 25%, and the inner quantum efficiency of the phosphorescence organic light emitting diode is about 100%. Thus, the phosphorescence organic light emitting diode has a better efficiency than the fluorescence organic light emitting diode.

The organic light emitting diode emits light by combination of electrons from a cathode and holes from an anode in an emission layer of the organic light emitting diode. Generally, the luminance efficiency in the low gray scale area is high, while the luminance efficiency in the high gray scale area is low and luminous bodies (sites) are saturated in the high gray scale area. Therefore, the luminance efficiency is sharply decreased in the high gray scale area.

SUMMARY

Aspects of embodiments of the present invention are directed toward an organic light emitting diode with improved efficiency and durability, and an organic light emitting display apparatus including the same. Example embodiments provide an organic light emitting diode with improved efficiency and durability by including a material having a low electron mobility.

Example embodiments also provide an organic light emitting display apparatus having the above-mentioned organic light emitting diode.

According to an example embodiment of the present invention, an organic light emitting diode includes a hole injection layer, a hole transport layer, an emission layer, an electron transport layer and an electron injection layer.

The hole transport layer is on the hole injection layer. The emission layer is on the hole transport layer. The electron transport layer is on the emission layer and including at least one selected from the group consisting of an anthracene derivative and a pyrene derivative. The electron injection layer is on the electron transport layer.

In an example embodiment of the present invention, the anthracene derivative may include a compound represented by Chemical Formula 1.

[Chemical Formula 1]

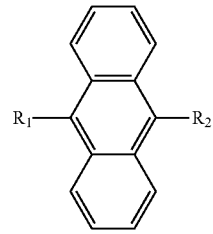

Here, $R_1$ is an alkyl group including a hydrogen atom or an aromatic hydrocarbon having 6 to 20 carbon atoms, and $R_2$ is an alkyl group including an aromatic hydrocarbon having 6 to 22 carbon atoms or a hetero aromatic functional group.

In an example embodiment of the present invention, the anthracene derivative may include at least one selected from the group consisting of the following compounds:

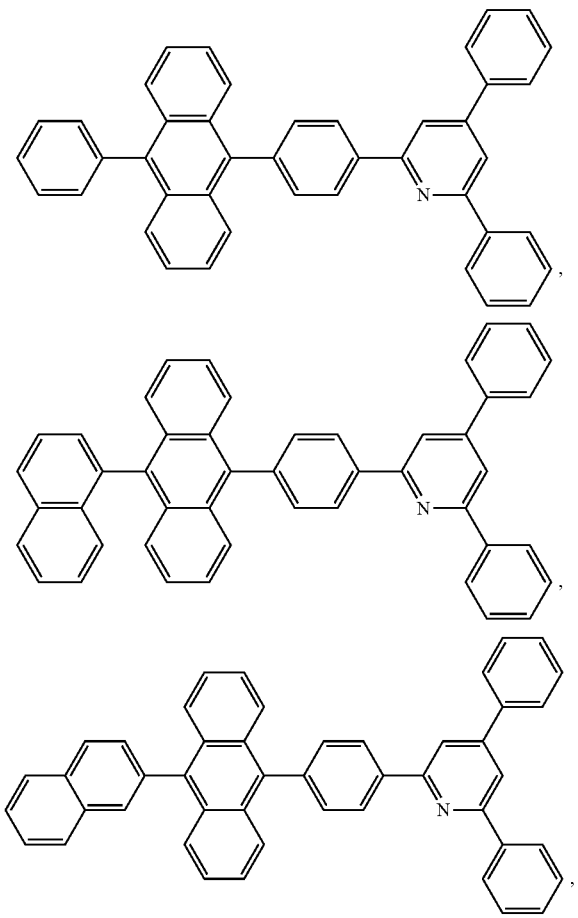

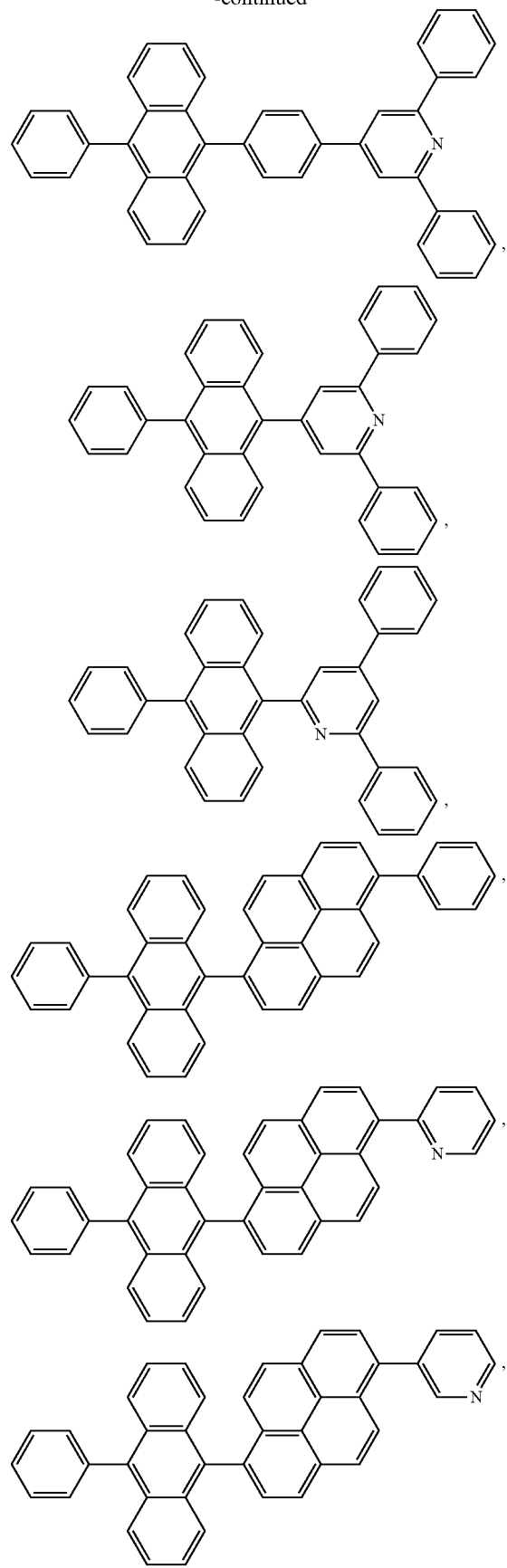
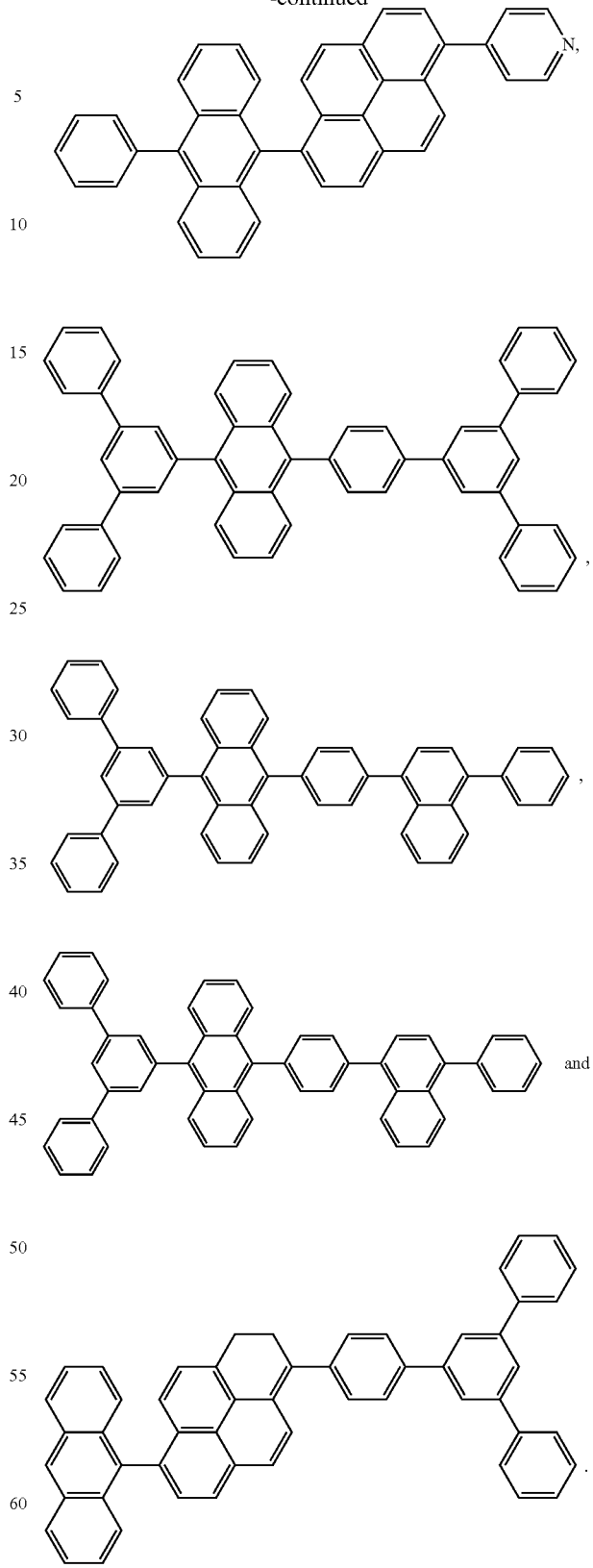
In an example embodiment of the present invention, the pyrene derivative may include a compound represented by Chemical Formula 2.

[Chemical Formula 2]

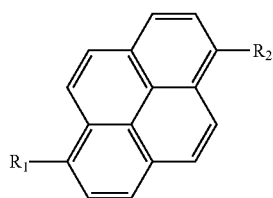

Here, R1 is an alkyl group including a hydrogen atom or an aromatic hydrocarbon having 6 to 20 carbon atoms, and R2 is an alkyl group including an aromatic hydrocarbon having 6 to 22 carbon atoms or a hetero aromatic functional group.

In an example embodiment of the present invention, the anthracene derivative comprises at least one selected from the group consisting of the following compounds:

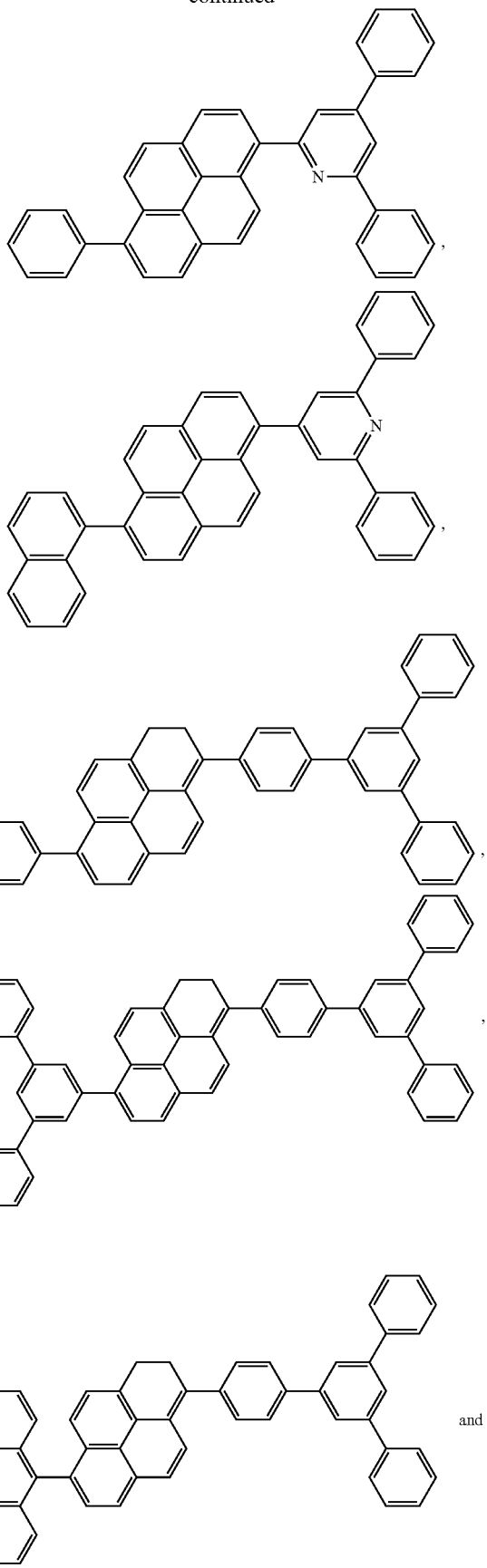

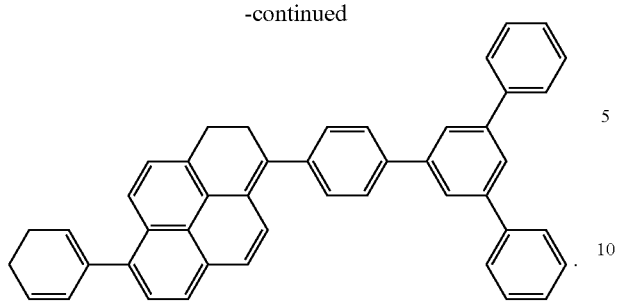

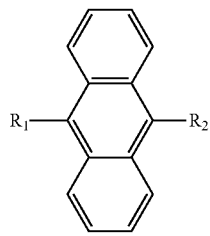

[Chemical Formula 1]

In an example embodiment of the present invention, the organic light emitting diode may further include a first electrode on a lower surface of the hole injection layer and a second electrode on an upper surface of the electron injection layer.

In an example embodiment of the present invention, the first electrode may be an anode electrode and the second electrode may be a cathode electrode.

In an example embodiment of the present invention, the electron transport layer may include a first electron transport layer on the emission layer and a second electron transport layer on the first electron transport layer.

In an example embodiment of the present invention, the first electron transport layer may include at least one selected from the group consisting of an anthracene derivative and a pyrene derivative.

In an example embodiment of the present invention, an electron mobility of the first electron transport layer may be less than $10^{-6}$ cm$^2$/V·s in an electric field of 800 to 1000 V/cm.

In an example embodiment of the present invention, an electron mobility of the second electron transport layer may be at least or more than $10^{-6}$ cm$^2$/V·s in an electric field of 800 to 1000 V/cm.

In an example embodiment of the present invention, a thickness of the first electron transport layer may be about 10 Å to about 300 Å.

According to an example embodiment of the present invention, an organic light emitting display apparatus includes a first substrate, a second substrate, a first electrode, a hole injection layer, a hole transport layer, an emission layer, an electron transport layer, an electron injection layer and a second electrode.

The second substrate faces the first substrate. The first electrode is on the first substrate. The hole injection layer is on the first substrate. The hole transport layer is on the hole injection layer. The emission layer is on the hole transport layer. The electron transport layer is on the emission layer and includes at least one selected from the group consisting of an anthracene derivative and a pyrene derivative. The electron injection layer is on the electron transport layer. The second electrode is on the electron injection layer.

In an example embodiment of the present invention, the anthracene derivative may include a compound represented by Chemical Formula 1.

Here, R1 is an alkyl group including a hydrogen atom or an aromatic hydrocarbon having 6 to 20 carbon atoms, and R2 is an alkyl group including an aromatic hydrocarbon having 6 to 22 carbon atoms or a hetero aromatic functional group.

In an example embodiment of the present invention, the anthracene derivative may include at least one selected from the group consisting of the following compounds:

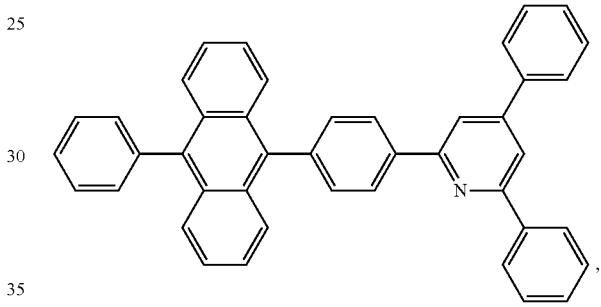

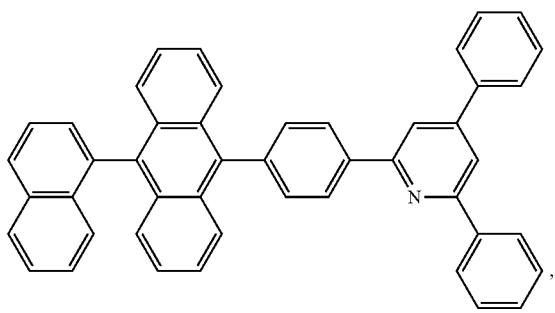

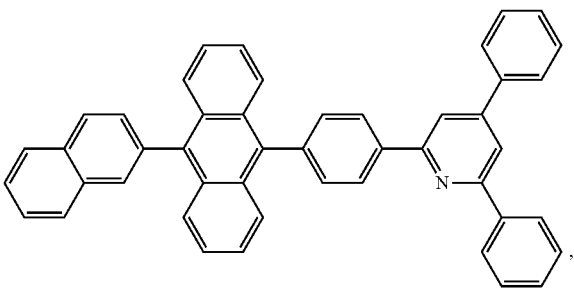

-continued
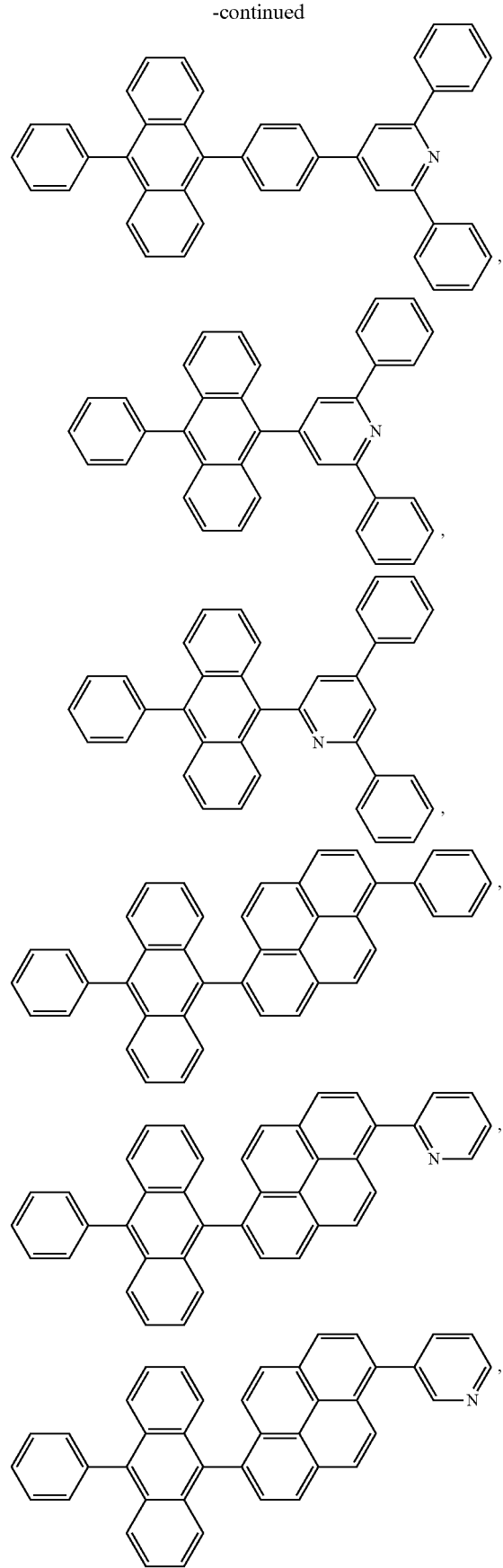
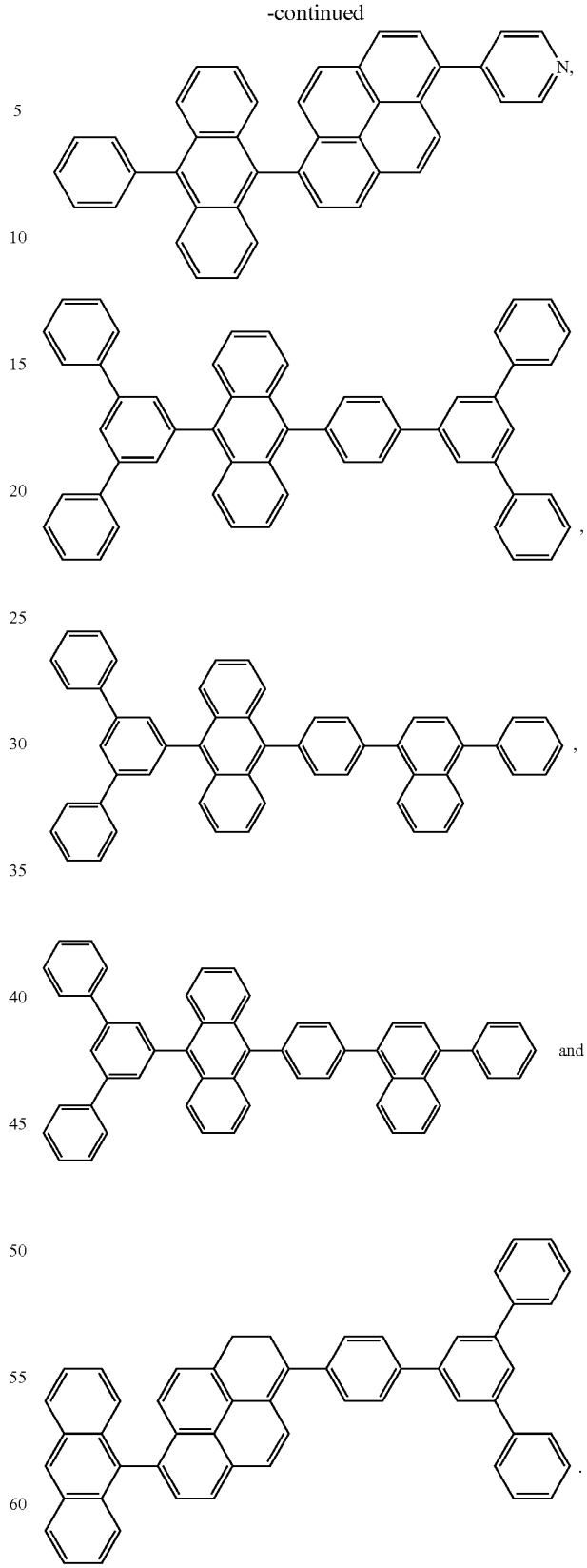
In an example embodiment of the present invention, the pyrene derivative may include a compound represented by Chemical Formula 2.

[Chemical Formula 2]

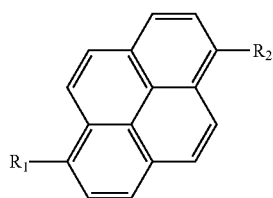

Here, R1 is an alkyl group including a hydrogen atom or an aromatic hydrocarbon having 6 to 20 carbon atoms, and R2 is an alkyl group including an aromatic hydrocarbon having 6 to 22 carbon atoms or a hetero aromatic functional group.

In an example embodiment of the present invention, the anthracene derivative comprises at least one selected from the group consisting of the following compounds:

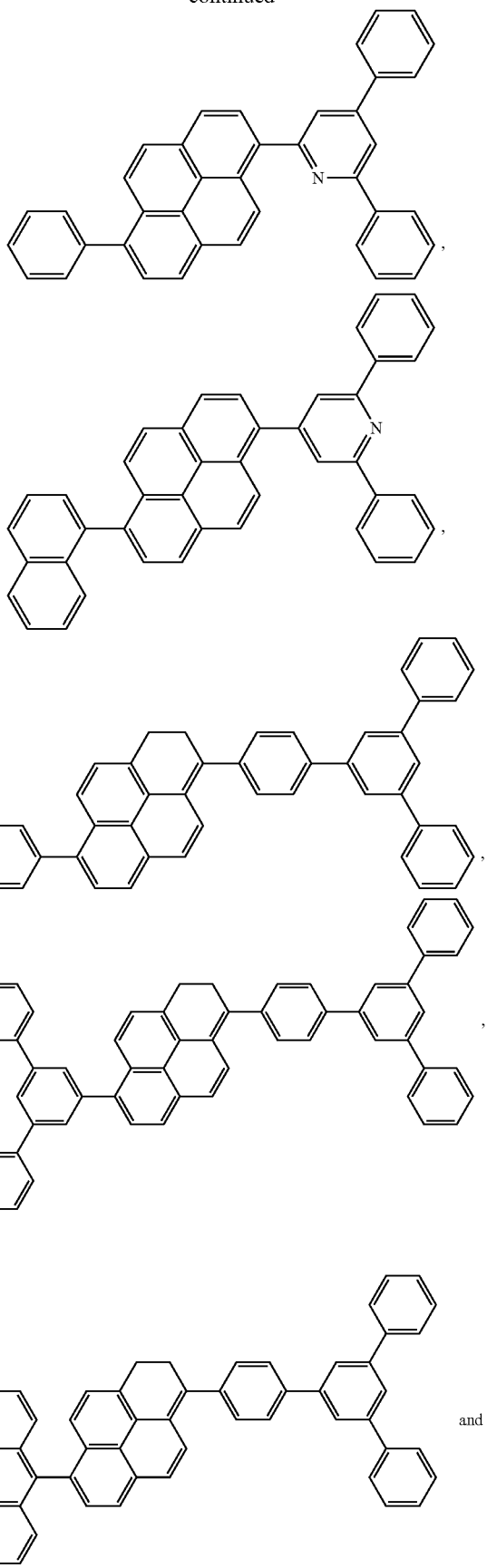

-continued

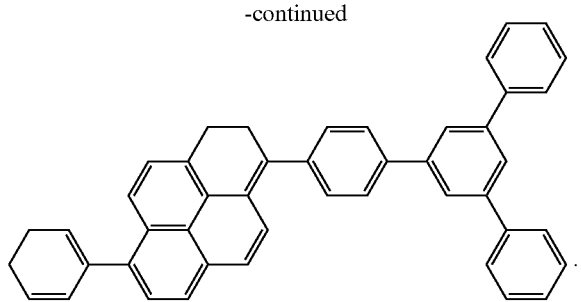

In an example embodiment of the present invention, the organic light emitting display apparatus may further include a protection layer on the first substrate, and covering the second electrode.

According to example embodiments of the present invention, an organic light emitting diode and an organic light emitting display apparatus include a material that is lower in electron mobility than that of a comparable material of the electron transport layer. Thus, a stain and a roll-off phenomenon in the low gray scale area may be improved.

BRIEF DESCRIPTION OF THE DRAWINGS

The present disclosure will become more apparent by describing in more detail example embodiments thereof with reference to the accompanying drawings, in which.

DETAILED DESCRIPTION

Figure 1:
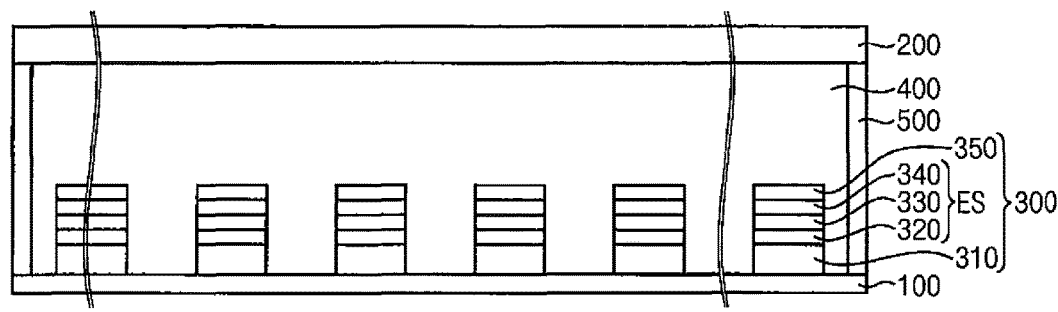
FIG. 1 is a cross-sectional view illustrating an organic light emitting display apparatus according to an example embodiment of the present invention.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

It will be understood that when an element is referred to as being "connected" or "coupled" to another element, it can be directly connected or coupled to the other element, or one or more intervening elements may be present therebetween. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
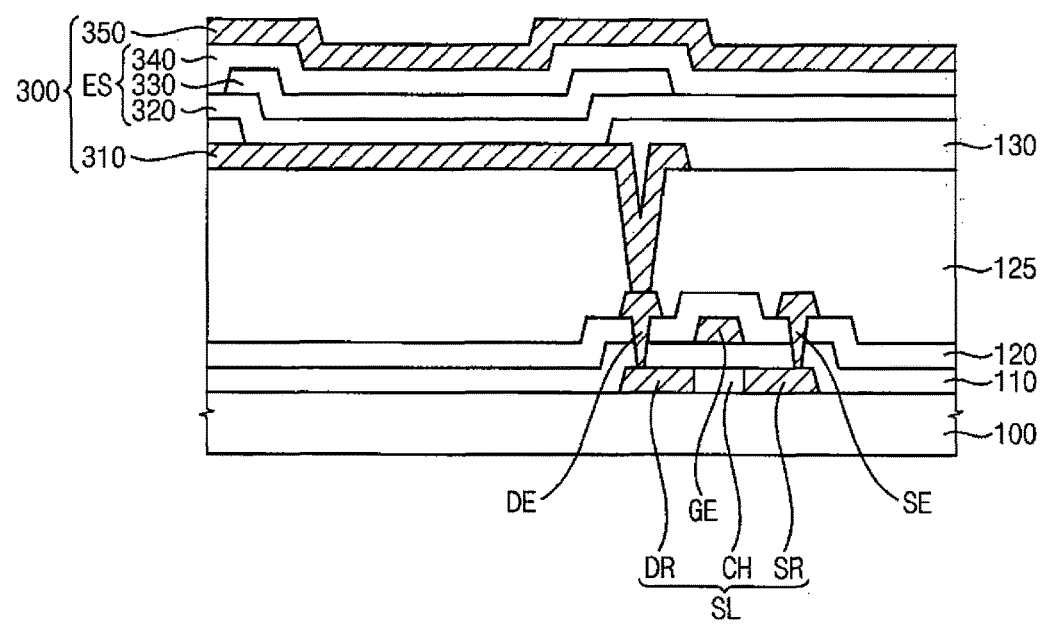
FIG. 2 is a partial enlarged-view illustrating the organic light emitting display apparatus in FIG. 1.

FIG. 1 is a cross-sectional view illustrating an organic light emitting display apparatus according to an example embodiment of the present invention. FIG. 2 is a partial enlarged-view illustrating the organic light emitting apparatus illustrated in FIG. 1.

Referring to FIGS. 1 and 2, an organic light emitting apparatus includes a first substrate 100 and a second substrate 200. The first substrate 100 may include a plurality of organic light emitting structures ES, which define the pixel areas. The second substrate 200 may face the first substrate 100 to encapsulate the organic light emitting structures ES. The organic light emitting display apparatus may further include a switching element (e.g., a thin film transistor) between the first substrate 100 and the organic light emitting structure ES. According to an example embodiment of the present invention, the organic light emitting display apparatus may further include a sealant 500 and an absorbent.

The first substrate 100 may be a transparent insulation substrate. Examples of the first substrate 100 may include, but are not limited to, a glass substrate, a quartz substrate, a plastic substrate, a polyethylene terephthalate resin substrate, a polyethylene resin substrate, a polycarbonate resin substrate, etc. Furthermore, the first substrate 100 may be a flexible substrate.

The switching element (e.g., a thin film transistor) may include a semiconductor layer SL, a gate insulation layer 110, a gate electrode GE, a first insulation layer 120, a drain electrode DE, a source electrode SE and a second insulation layer 125.

The semiconductor layer SL may be formed on the first substrate 100. The semiconductor layer SL may include a channel region CH, a drain region DR and a source region SR. The drain region DR may be electrically connected to the drain electrode DE. The source region SR may be electrically connected to the source electrode SE. The channel region CH may be disposed between the drain region DR and the source region SR.

The gate insulation layer 110 may be disposed on the first substrate 100, where the semiconductor layer SL is formed. The gate insulation layer 110 may cover the semiconductor layer SL. The gate insulation layer 110 may include a silicon oxide, a silicon nitride, etc.

The gate electrode GE may be electrically connected to the gate line to receive a gate signal. The gate electrode GE may overlap the channel region CH. For example, the gate electrode GE may be formed in (or at) a same layer as the gate line.

The first insulation layer 120 may be disposed on the first substrate 100, where the gate electrode GE is formed. The first insulation layer 120 may cover the gate electrode GE. The first insulation layer 120 may include a silicon oxide, a silicon nitride, etc.

The source electrode SE may be electrically connected to the source region SR of the semiconductor layer SL through a first contact hole and may be provided with a data signal from a data line. The first contact hole is formed through the gate insulation layer 110 and the first insulation layer 120.

The drain electrode DE may be electrically connected to the drain region DR of the semiconductor layer SL through a second contact hole. The second contact hole is formed through the gate insulation layer 110 and the first insulation layer 120.

The switching element in FIG. 2 has a top-gate structure including a gate electrode GE disposed on a semiconductor layer SL, however, examples of the switching element are not limited thereto. For example, another example of the switching element may have a bottom-gate structure including a semiconductor layer disposed on a gate electrode.

The second insulation layer 125 may be disposed on the first substrate 100, where the source electrode SE and the drain electrode DE are formed. The second insulation layer 125 may cover the source electrode SE and the drain electrode DE. The second insulation layer 125 may have a substantially flat upper surface.

Each of the organic light emitting diode 300 may include a first electrode 310, an organic light emitting structure ES and a second electrode 350.

The first electrode 310 may be disposed on the first substrate 100, where the second insulation layer 125 is formed. The first electrode 310 may be electrically connected to the drain electrode DE. The first electrode 310 may be a transparent electrode or a translucent electrode. Examples of a suitable material that may be used for the first electrode 310 include, but are not limited to, indium zinc oxide (ITO), indium tin oxide (IZO), zinc oxide (ZnOx) and tin oxide (SnOx). The first electrode 310 may be an anode providing holes to the organic light emitting structure ES.

The organic light emitting display apparatus may further include a pixel defining layer 130 disposed between the organic light emitting structure ES and the first electrode 310. The pixel defining layer 130 may be disposed on the first electrode 310 and the second insulation layer 125. The pixel defining layer 130 may include an opening. The opening may expose a portion of the first electrode 310. The organic light emitting structure ES is disposed on the portion of the first electrode 310 exposed by the pixel defining layer 130, and the second electrode 350 is disposed on the organic light emitting structure ES. Thus, an area, where the opening is located, may be defined as a display area, and a remaining area may be defined as a peripheral area.

The pixel defining layer 130 may include an organic insulation material, such as a normal (or typical) polymer, for example, polymer derivative including a phenol group, polyacryl, polyimide, polyarylether, polyamide, fluorinated polymer, p-xylene polymer, vinylalcohol polymer and mixture thereof. Alternatively, the pixel defining layer 130 may include an inorganic insulation material. The pixel defining layer 130 may have a multi-layered structure including an organic insulation material and an inorganic insulation material.

The light emitting diode 300 includes a hole injection layer and a hole transfer layer 320, an emission layer 330 and an electron transfer layer and an electron injection layer 340. Holes may be provided from the first electrode 310 into the hole injection layer and the hole transfer layer 320. Electrons may be provided from the second electrode 350 into the electron transfer layer and the electron injection layer 340.

Holes and electrons may be combined in the emission layer 330 to thereby generate a light. The organic light emitting diode 300 may include a light emitting material generating a red light, a green light, or a blue light. Alternatively, the organic light emitting diode 300 may include a plurality of light emitting materials generating lights having different wavelengths or mixture thereof. A more detailed description about the organic light emitting diode 300 will be further descried in FIGS. 3 and 4.

The second electrode 350 may be disposed on the first substrate 100, where the organic light emitting structure ES is disposed. The second electrode 350 may include a reflective electrode. Examples of a suitable material that may be used for the second electrode 350 may include aluminum (Al), platinum (Pt), silver (Ag), gold (Au), chromium (Cr), tungsten (W), molybdenum (Mo), titanium (Ti), and alloy thereof. The second electrode 350 may be a cathode providing electrons to the organic light emitting structure ES.

The organic light emitting display apparatus may include a protection layer 400 disposed on the first substrate 100. The protection layer 400 may cover the second electrode 350. The protection layer 400 may include a silicon-based encapsulant (e.g., a silicon encapsulant). The silicon-based encapsulant may have a good flowablility and may be easily hardened at a low temperature. Thus, the silicon-based encapsulant may decrease thermal stress generated during a molding (or a manufacturing) process, so that bending of the first substrate 100 and the second substrate 200 may be reduced or minimized.

The organic light emitting display apparatus may include a sealant 500 sealing the first substrate 100 and the second substrate 200. The sealant 500 may protect the organic light emitting structure ES from an outside air. Furthermore, the sealant 500 may prevent a phenomenon where a material of the protection layer 400 flows out from the substrates. For example, the sealant 500 may include an ultraviolet hardener such as an epoxy resin or a thermal hardener.

The organic light emitting display apparatus includes the second substrate 200 facing the first substrate 100. The second substrate 200 may encapsulate the organic light emitting diode 300. The second substrate 200 may be a transparent insulation substrate. Examples of the second substrate 200 may include, but are not limited to, a glass substrate, a quartz substrate, a plastic substrate, a polyethylene terephthalate resin substrate, a polyethylene resin substrate, a polycarbonate resin substrate, etc. Furthermore, the second substrate 200 may be a flexible substrate. The first substrate 100 and the second substrate 200 may be formed from a substantially identical material. Alternatively, the first substrate 100 and the second substrate 200 may be formed from different materials.

The organic light emitting display apparatus may include at least one absorbent. The absorbent may be disposed on a lower surface of the second substrate 200 facing the organic light emitting structures. Examples of a suitable material that may be used for the absorbent include barium oxide, gallium oxide, calcium oxide, zeolite and other metal oxides. Alternatively, the absorbent may include a transparent porous nano polymer layer.

Figure 3:
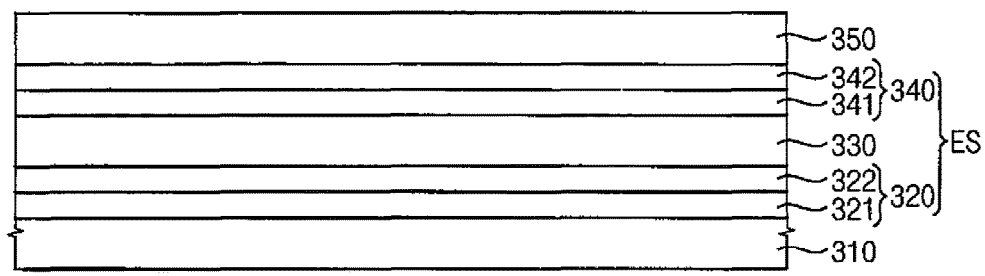
FIG. 3 is a cross-sectional view illustrating an organic light emitting diode according to an example embodiment of the present invention.
Figure 4:
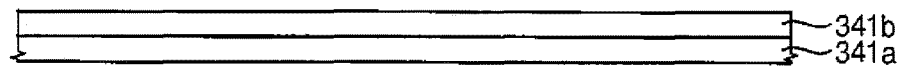
FIG. 4 is a cross-sectional view illustrating an electron transport layer according to an example embodiment of the present invention.

FIG. 3 is a cross-sectional view illustrating an organic light emitting diode according to an example embodiment of the present invention. FIG. 4 is a cross-sectional view illustrating an electron transport layer according to an example embodiment of the present invention.

Referring to FIG. 3, an organic light emitting diode 300 include a first electrode 310, a hole injection layer 321 disposed on the first electrode 310, a hole transport layer 322 disposed on the hole injection layer 321, an emission layer 330 disposed on the hole transport layer 322, an electron transport layer 341 disposed on the emission layer 330, an electron injection layer 342 disposed on the electron transport layer 341 and a second electrode 350 disposed on the electron injection layer 342.

The first electrode 310 may be an anode providing holes into the hole injection layer 321. The second electrode 350 may be a cathode providing electrons into the electron injection layer 342.

The first electrode 310 may provide holes into the hole injection layer 321 and the hole transport layer 322. The second electrode 350 may provide electrons into the electron transport layer 341 and the electron injection layer 342.

Holes and electrons may be combined in the emission layer 330, to thereby generate light. The organic light emitting diode 300 may include a light emitting material that generates a red light, a green light, or a blue light. Alternatively, the organic light emitting diode 300 may include a plurality of light emitting materials generating lights having different wavelengths or mixture thereof.

According to an example embodiment of the present invention, the electron transport layer 340 may include at least one selected from an anthracene derivative and a pyrene derivative.

The electron mobility of a material including an anthracene derivative and/or a pyrene derivative is at or less than $10^{-6}$ cm$^2$/V·s in an electric field of 800 to 1000 V/cm. The electron transport layer 340 may further include a material having an electron mobility equal to or more than about $10^{-6}$ cm$^2$/V·s in an electric field of 800 to 1000 V/cm. That is, the electron transport layer 340 may include a mixture of materials having different electron mobility.

When the electron transport layer 340 includes only a material having high electron mobility, the current efficiency may be increased by over-injected electrons in the low gray area. Thus, a stain in a black level may occur by a high current efficiency in the low gray area. Furthermore, a roll-off phenomenon, where the luminance efficiency sharply decreases by the saturation of the luminous bodies (or sites), may occur.

The electron transport layer 340 may include a material having a low electron mobility, so that electrons flowing into the emission layer 330 may be reduced. Thus, a current efficiency in the low gray area may be decreased so that the stain in the black level is reduced or prevented by decreasing the current efficiency in the low gray area. Thus, a sharp decrease of the current efficiency in a high gray area may be reduced or prevented.

The anthracene derivative may include a compound represented by Chemical Formula 1. Here, R1 is an alkyl group including a hydrogen atom or an aromatic hydrocarbon having 6 to 20 carbon atoms, R2 is an alkyl group including an aromatic hydrocarbon having 6 to 22 carbon atoms or a hetero aromatic functional group.

[Chemical Formula 1]

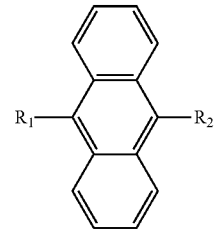

The anthracene derivative may be, but are not limited to,

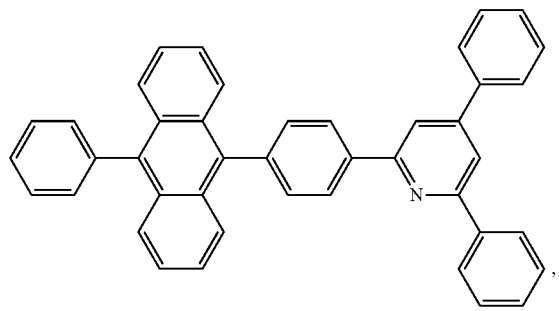

,

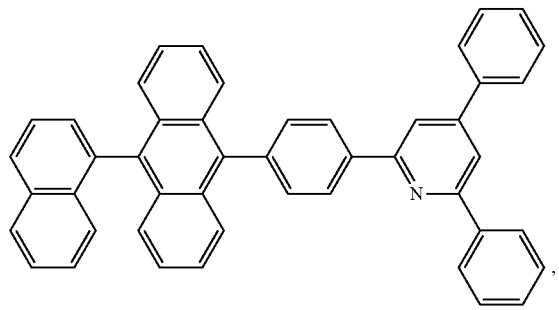

,

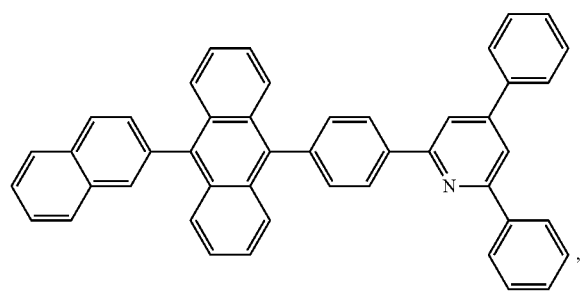

,

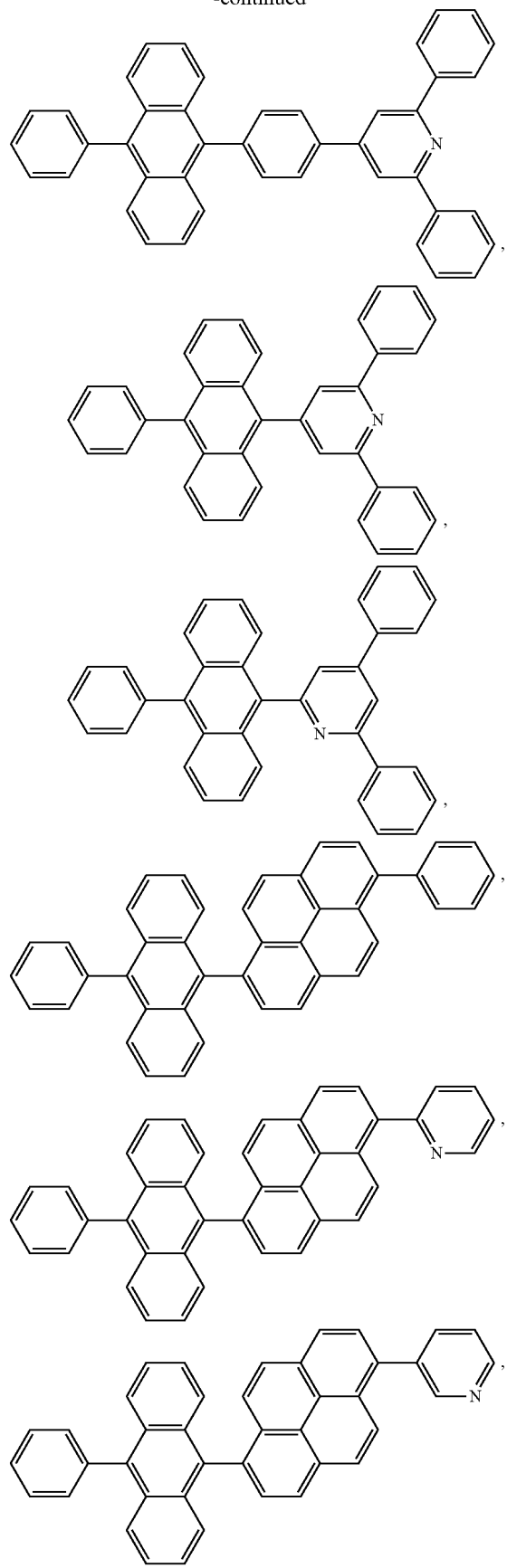
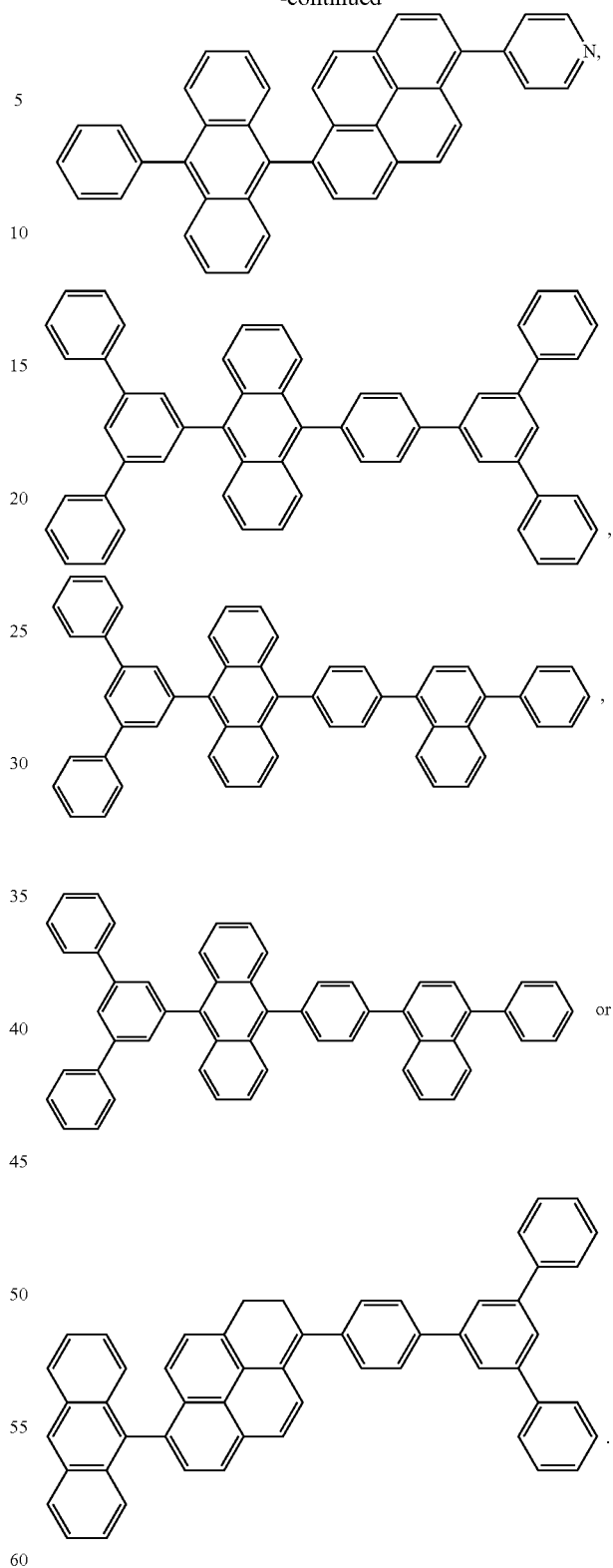
The pyrene derivative may include a compound represented by Chemical Formula 2. Here, R1 is an alkyl group including a hydrogen atom or an aromatic hydrocarbon having 6 to 20 carbon atoms, R2 is an alkyl group including an aromatic hydrocarbon having 6 to 22 carbon atoms or a hetero aromatic functional group.

[Chemical Formula 2]
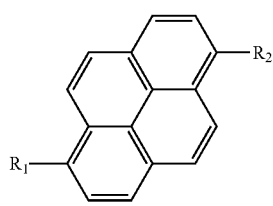
The anthracene derivative may be, but are not limited to,
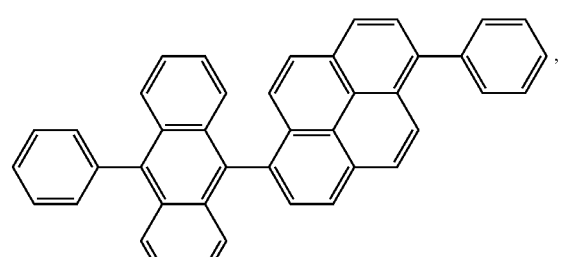
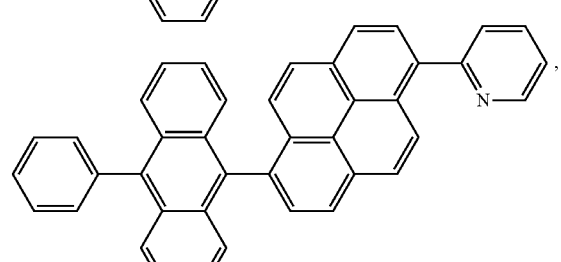
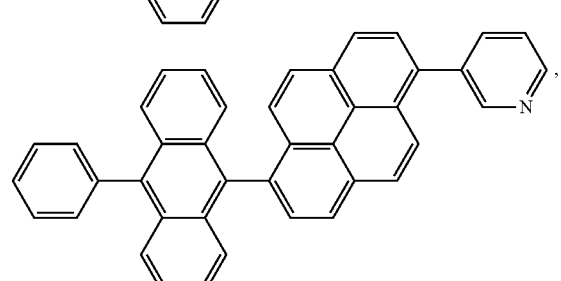
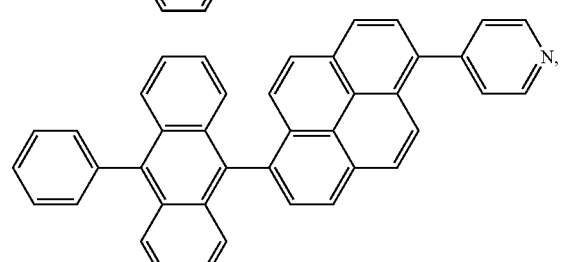
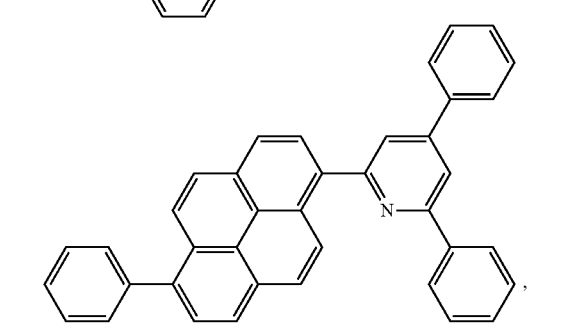
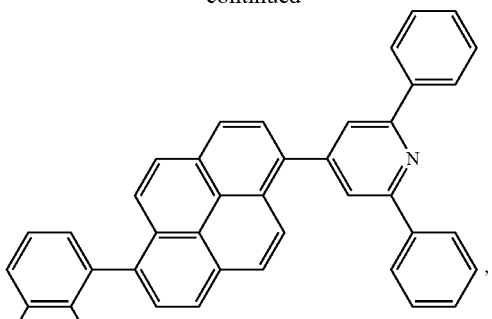
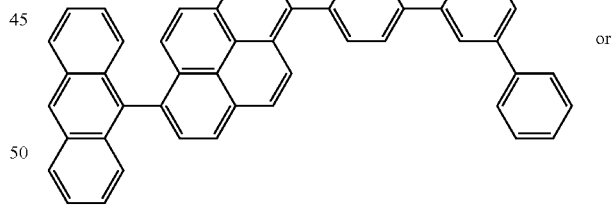
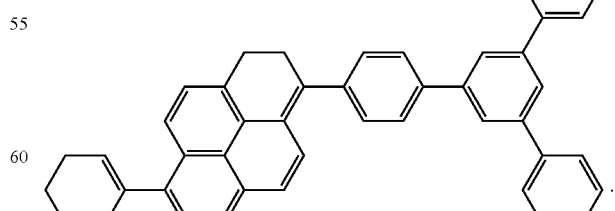
or
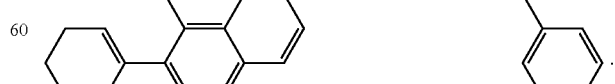
.
Alternatively, the electron transport layer 340 may include a first electron transport layer 341a disposed on the emission layer 330 and a second electron transport layer 341b disposed on the first electron transport layer 341a. Thus, the electron transport layer 340 may have multiple layers.

The first electron transport layer 341a may include at least one selected from an anthracene derivative and a pyrene derivative. The electron mobility of the first electron transport layer 341a including at least one selected from an anthracene derivative and a pyrene derivative may be within a range about $10^{-10}$ to less than about $10^{-6}$ cm$^2$/V·s in an electric field of 800 to 1000 V/cm. The second electron transport layer 341b may include a material having an electron mobility which is equal to or more than about $10^{-6}$ cm$^2$/V·s in an electric field of 800 to 1000 V/cm.

When the electron transport layer 340 includes only a material having high electron mobility, a current efficiency may increase by over-injected electrons in the low gray area. Thus, a stain in a black level may occur by a high current efficiency in the low gray area. Furthermore, a roll-off phenomenon, where the luminance efficiency sharply decreases by the saturation of the luminous bodies, may occur.

The electron transport layer 340 may include a material having low electron mobility, so that electrons flowing into the emission layer 330 may be reduced. That is, the current efficiency in the low gray area may be decreased. The stain in the black level may be reduced by decreasing the current efficiency in the low gray area. Thus, a sharp decrease of the current efficiency in the high gray area may be reduced or prevented.

The electron transport layer 340 may include a first electron transport layer 341a and a second electron transport layer 341b. A thickness of the first electron transport layer 341a may be within a range of about 10 Å to about 300 Å. For example, the thickness of the first electron transport layer 341a may be within a range of about 30 Å to about 150 Å.

When the thickness of the first electron transport layer 341a is less than 10 Å, the mobility of electrons from the cathode may not be reduced efficiently. When the thickness of the first electron transport layer 341a is more than 300 Å, the mobility of electrons is too restrictive (too low), so that a current efficiency is too low.

Figure 5:
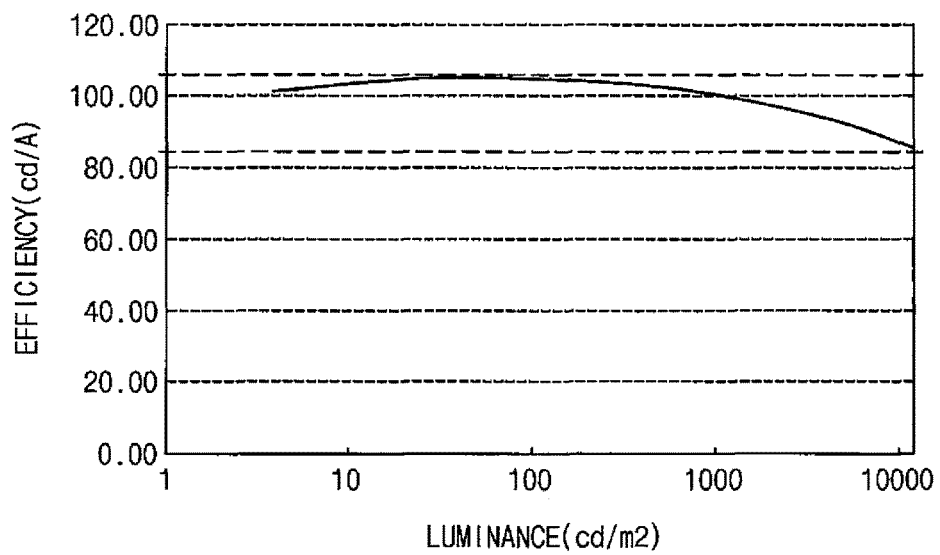
FIGS. 5 and 6 are each a graph illustrating current efficiency versus luminance of an organic light emitting apparatus according to an example of the present invention.
Figure 6:
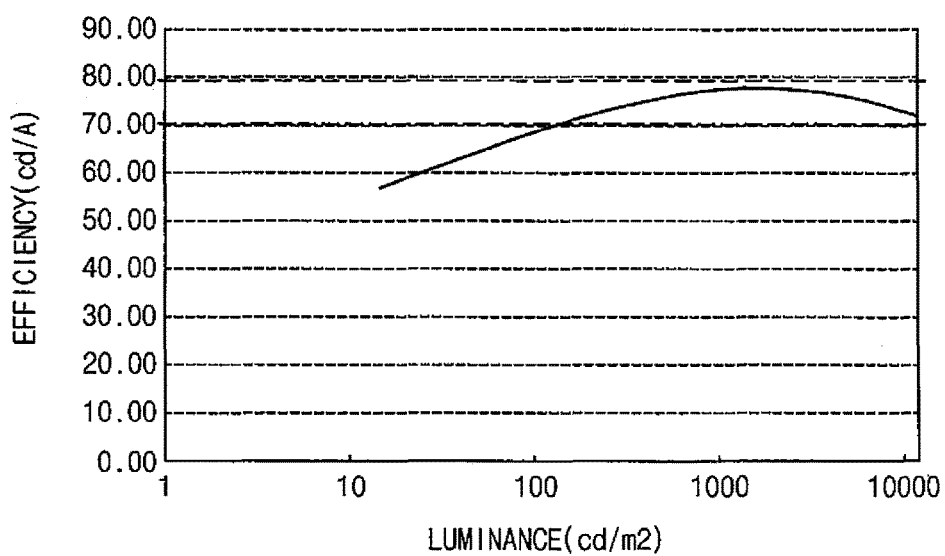

FIGS. 5 and 6 are each a graph illustrating current efficiency versus luminance of an organic light emitting apparatus according to an example of the present invention.

FIG. 5 is a graph illustrating the current efficiency of an organic light emitting display apparatus including a pyridine. FIG. 6 is a graph illustrating the current efficiency of an organic light emitting display apparatus including an anthracene derivative.

Referring to FIG. 5, when the luminance is 10 cd/m$^2$, which is in a low gray scale area, the current efficiency is about 100 cd/A. When the luminance is 10000 cd/m$^2$, which is in a high gray scale area, the current efficiency is about 80 cd/A. Therefore, it can be noted that the current efficiency decreases by about 20% when the luminance increases.

Referring to FIG. 6, when the luminance is 10 cd/m$^2$, which is in a low gray scale area, the current efficiency is about 60 cd/A. When the luminance is 10000 cd/m$^2$, which is in a high gray scale area, the current efficiency is about 71 cd/A. In addition, a highest current density of about 76 cd/A is observed when the luminance is between 1000 and 10000 cd/m$^2$. Therefore, it can be noted that the current efficiency in a high gray scale area decreases by about 6% in comparison to the highest current efficiency.

Thus, it can be noted that a roll-off phenomenon where luminance efficiency sharply decreases by the saturation of the luminous bodies is improved (i.e., this roll-off phenomenon is reduced).

Here, an organic light emitting display apparatus according to an example embodiment of the present invention may be manufactured by the following method. A first electrode may be coated on a first substrate 100. A pixel defining layer may be coated on the first substrate. A hole injection layer may be coated on the first substrate. A hole transport layer may be coated on the hole injection layer and include at least one selected from an anthracene derivative and a pyrene derivative. An emission layer may be coated on the hole transport layer. The electron transport layer may be coated on the emission layer. The electron injection layer 342 may be coated on the electron transport layer. The second electrode 350 may be coated on the electron injection layer.

According to example embodiments of the present invention, an organic light emitting diode may have improved efficiency and durability. Thus, an organic light emitting diode and an organic light emitting display apparatus with improved resolution may be provided.

The invention according to embodiments of the present invention may be applied in display apparatus. For example, an example embodiment of the present invention is described as a top emitting organic light emitting display apparatus. Alternatively, an example embodiment of the present invention may be applied in a backward (or bottom) emitting organic light emitting display apparatus or a both side-emitting organic light emitting display apparatus. Thus, when the organic light emitting display apparatus having a structure that a second electrode is connected to another element through a via hole in a pixel defining layer, those skilled in the art will readily appreciate that many modifications are possible. An example embodiment of the present invention may be applied in a RGB organic light emitting display apparatus having a red, a blue and a green sub-pixel or a white organic light emitting display apparatus emitting a white light. The organic light emitting display apparatus may be applied in an electronic display apparatus, such as a television, a PC monitor, a display of mobile device, etc.

The foregoing is illustrative of the invention and is not to be construed as limiting thereof. Although a few example embodiments of the invention have been described, those skilled in the art will readily appreciate that many modifications are possible in the example embodiments without materially departing from the novel teachings and advantages of the invention. Accordingly, all such modifications are intended to be included within the scope of the invention as defined in the claims, and equivalents thereof. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific example embodiments disclosed, and that modifications to the disclosed example embodiments, as well as other example embodiments, are intended to be included within the scope of the appended claims. The invention is defined by the following claims, and equivalents thereof.

What is claimed is:

1. An organic light emitting diode comprising:
   a hole injection layer;
   a hole transport layer on the hole injection layer;
   an emission layer on the hole transport layer;
   an electron transport layer on the emission layer and comprising at least one selected from the group consisting of an anthracene derivative represented by Chemical Formula 1 and a pyrene derivative represented by Chemical Formula 2; and
   an electron injection layer on the electron transport layer,

[Chemical Formula 1]

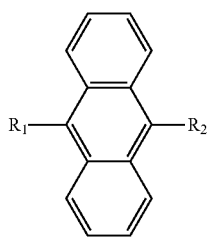

wherein in Chemical Formula 1, $R_1$ is an alkyl group comprising a hydrogen atom or an aromatic hydrocarbon having 6 to 20 carbon atoms, and $R_2$ is an alkyl group comprising an aromatic hydrocarbon having 6 to 22 carbon atoms or a substituted or unsubstituted pyridyl group;

[Chemical Formula 2]

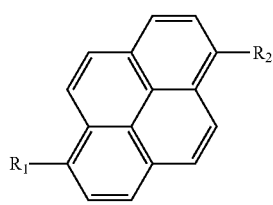

wherein in Chemical Formula 2, $R_1$ is a hydrogen atom or an aromatic hydrocarbon having 6 to 20 carbon atoms, and $R_2$ is an aromatic hydrocarbon having 6 to 22 carbon atoms or a substituted or unsubstituted pyridyl group.

2. The organic light emitting diode of claim 1, wherein the anthracene derivative comprises at least one selected from the group consisting of the following compounds:

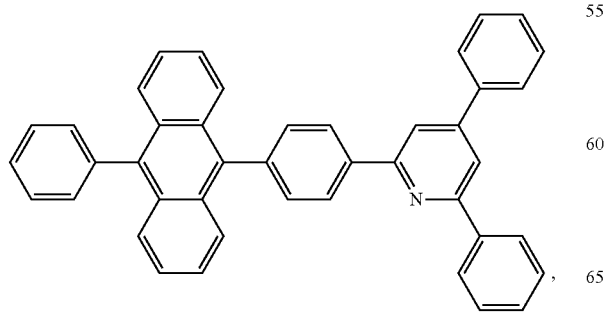

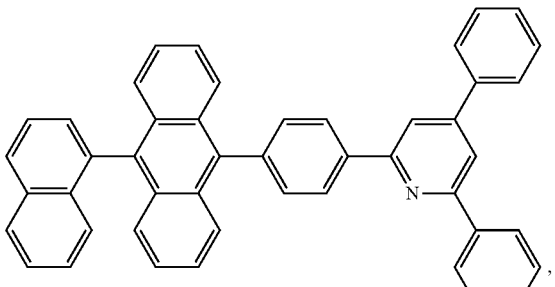

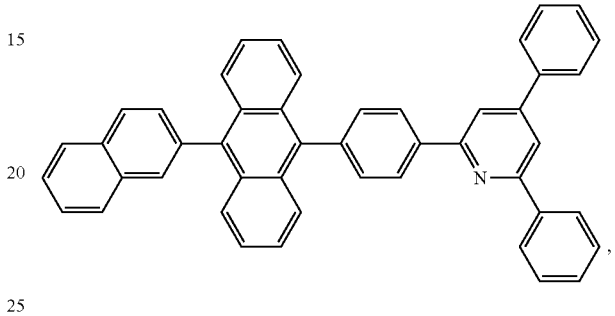

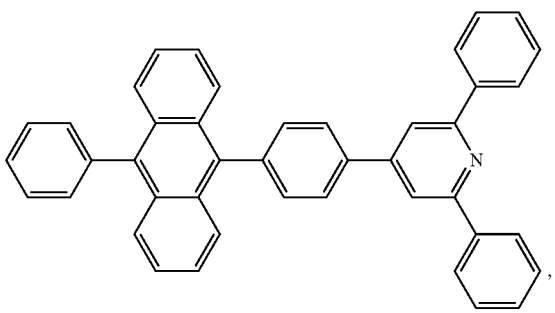

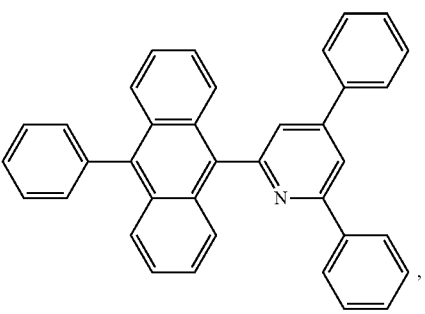

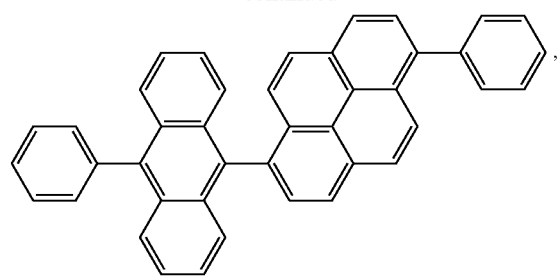
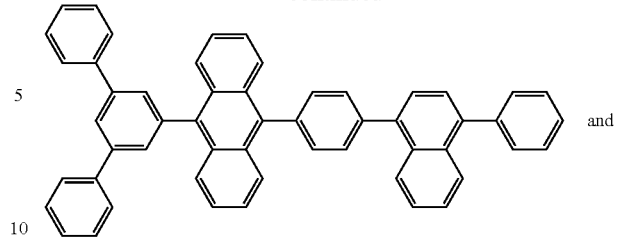
3. The organic light emitting diode of claim 1, wherein the pyrene derivative comprises at least one selected from the group consisting of the following compounds:
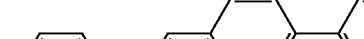
and -continued

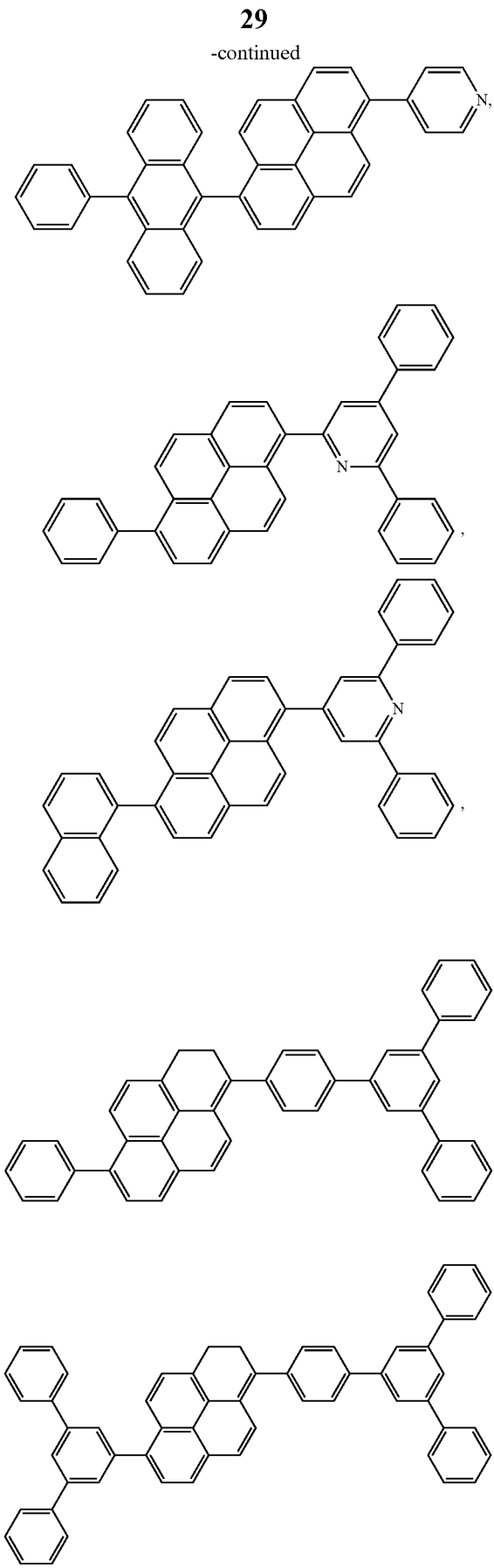

-continued

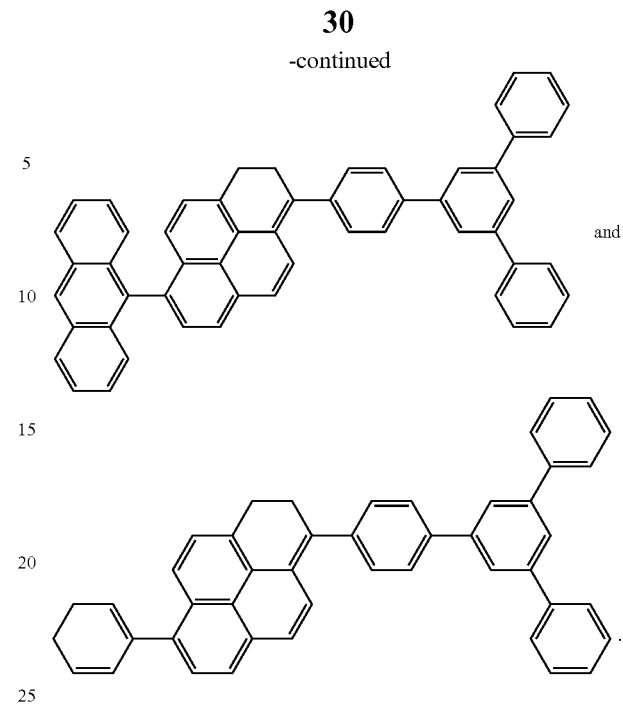

4. The organic light emitting diode of claim 1, further comprising:
a first electrode on a lower surface of the hole injection layer; and
a second electrode on an upper surface of the electron injection layer.

5. The organic light emitting diode of claim 4, wherein the first electrode is an anode electrode, and the second electrode is a cathode electrode.

6. The organic light emitting diode of claim 1, wherein the electron transport layer comprises a first electron transport layer on the emission layer and a second electron transport layer on the first electron transport layer.

7. The organic light emitting diode of claim 6, wherein the first electron transport layer comprises at least one selected from the group consisting of an anthracene derivative and a pyrene derivative.

8. The organic light emitting diode of claim 7, wherein an electron mobility of the first electron transport layer is within a range of about $10^{-10}$ to less than about $10^{-6}$ cm$^2$/V·s in an electric field of 800 to 1000 V/cm.

9. The organic light emitting diode of the claim 6, wherein an electron mobility of the second electron transport layer is equal to or more than about $10^{-6}$ cm$^2$/V·s in an electric field of 800 to 1000 V/cm.

10. The organic light emitting diode of the claim 6, wherein a thickness of the first electron transport layer is about 10 Å to about 300 Å.

11. An organic light emitting display apparatus comprising:
a first substrate;
a second substrate facing the first substrate;
a first electrode on the first substrate;
a hole injection layer on the first substrate;
a hole transport layer on the hole injection layer;
an emission layer on the hole transport layer;
an electron transport layer on the emission layer and comprising at least one selected from the group consisting of an anthracene derivative represented by Chemical Formula 1 and a pyrene derivative represented by Chemical Formula 2;

an electron injection layer on the electron transport layer; and
a second electrode on the electron injection layer,

[Chemical Formula 1]

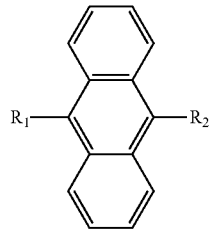

wherein in Chemical Formula 1, R₁ is an alkyl group comprising a hydrogen atom or an aromatic hydrocarbon having 6 to 20 carbon atoms, and R₂ is an alkyl group comprising an aromatic hydrocarbon having 6 to 22 carbon atoms or a substituted or unsubstituted pyridyl group;

[Chemical Formula 2]

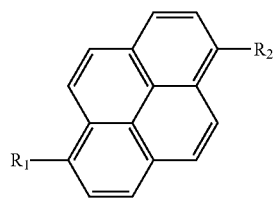

wherein in Chemical Formula 2, R₁ is an alkyl group comprising a hydrogen atom or an aromatic hydrocarbon having 6 to 20 carbon atoms, and R₂ is an alkyl group comprising an aromatic hydrocarbon having 6 to 22 carbon atoms or a substituted or unsubstituted pyridyl group.

12. The organic light emitting display apparatus of claim 11, wherein the anthracene derivative comprises at least one selected from the group consisting of the following compounds:

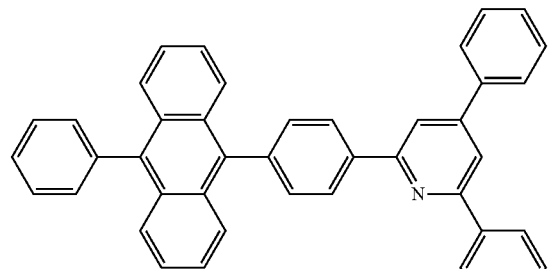

,

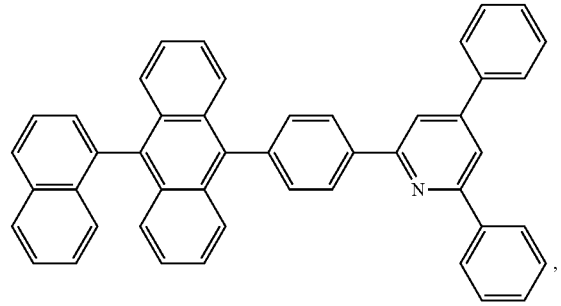

,

-continued

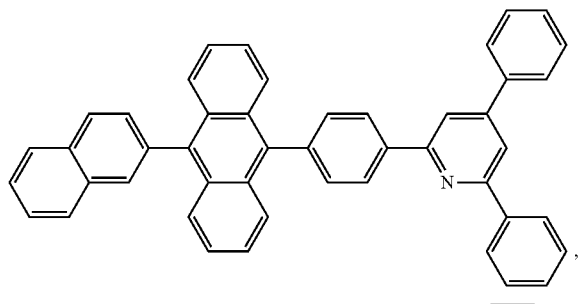

,

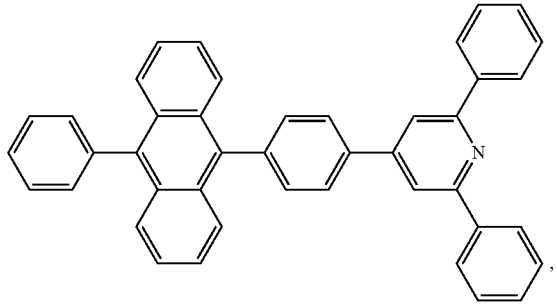

,

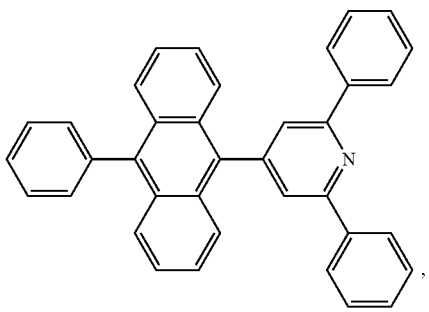

,

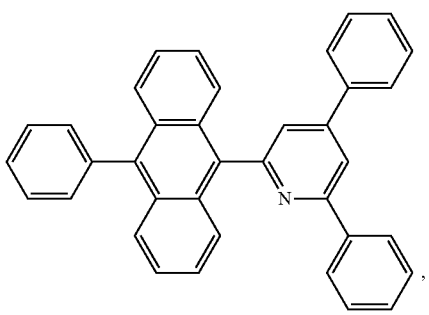

,

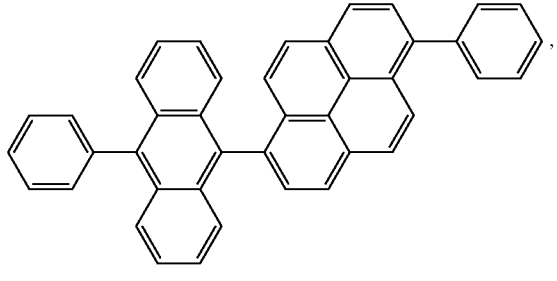

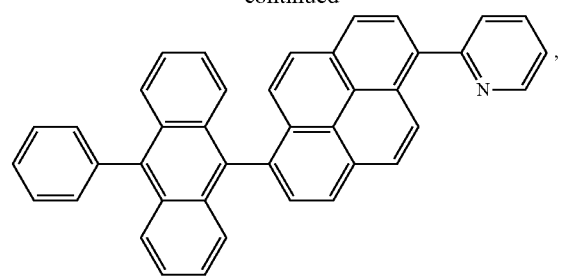
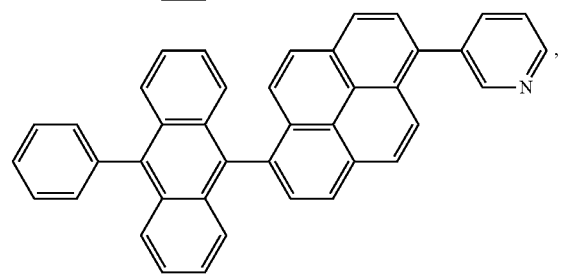
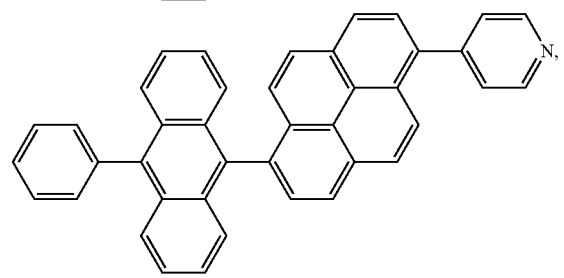
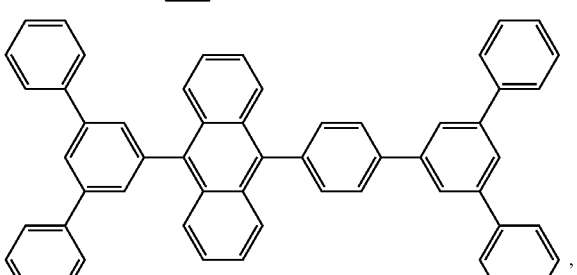
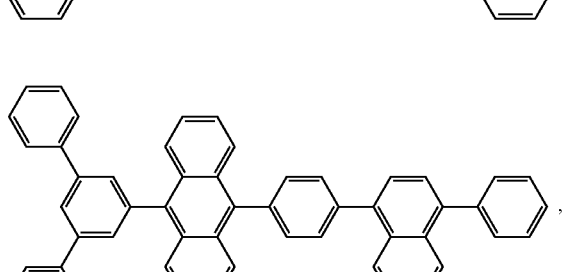
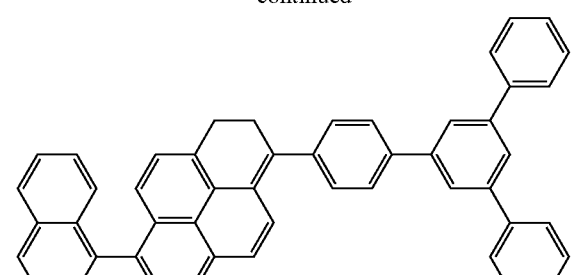
13. The organic light emitting display apparatus of claim 12, wherein the pyrene derivative comprises at least one selected from the group consisting of the following compounds:
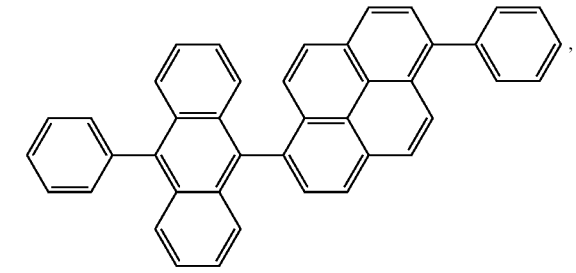
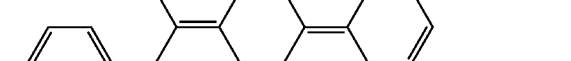

-continued
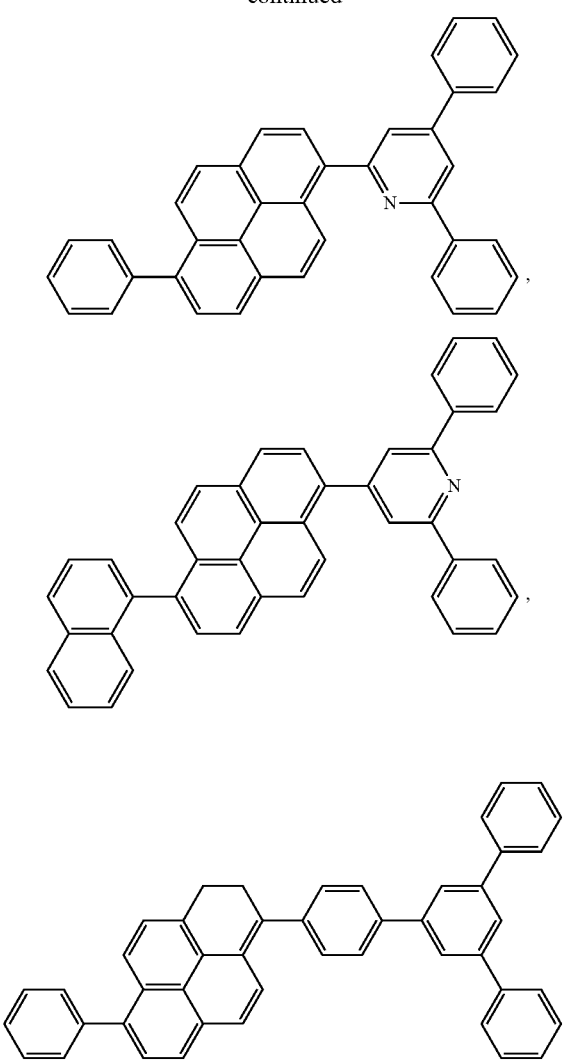
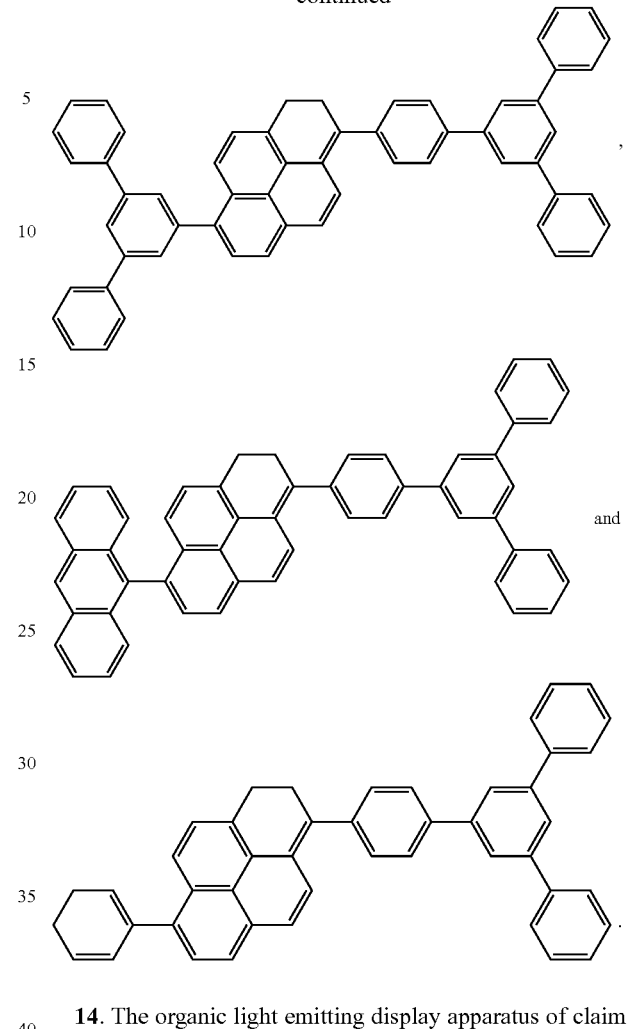
14. The organic light emitting display apparatus of claim 12, further comprising a protection layer on the first substrate and covering the second electrode.
* * * * *